(12) United States Patent
Shimazawa et al.

(10) Patent No.: US 6,769,170 B1
(45) Date of Patent: Aug. 3, 2004

(54) METHOD FOR STABILIZING PROPERTIES OF A FERROMAGNETIC TUNNEL JUNCTION ELEMENT

(75) Inventors: Koji Shimazawa, Tokyo (JP); Satoru Araki, Tokyo (JP)

(73) Assignee: TDK Corporation, Tokyo (JP)

( * ) Notice: Subject to any disclaimer, the term of this patent is extended or adjusted under 35 U.S.C. 154(b) by 85 days.

(21) Appl. No.: 09/612,310

(22) Filed: Jul. 7, 2000

(30) Foreign Application Priority Data

Aug. 24, 1999 (JP) .......................................... 11-237611

(51) Int. Cl.[7] .......................... G11B 5/127; G01R 33/02
(52) U.S. Cl. .............................. 29/603.09; 29/603.01; 29/603.08; 29/593; 360/324; 360/324.2; 338/92; 324/244
(58) Field of Search ....................... 29/603.09, 603.01, 29/603.08, 603.07, 846, 611, 593; 360/324.2, 324; 324/252, 244; 336/200; 338/92

(56) References Cited

U.S. PATENT DOCUMENTS

| | | | | |
|---|---|---|---|---|
| 5,548,265 A | * | 8/1996 | Saito | ........................... 336/200 |
| 5,695,864 A | * | 12/1997 | Slonczewski | ................ 324/252 |
| 5,712,612 A | * | 1/1998 | Lee et al. | ................. 360/324.2 |
| 5,801,984 A | | 9/1998 | Parkin | |

FOREIGN PATENT DOCUMENTS

| | | |
|---|---|---|
| JP | A-4-42417 | 2/1992 |
| JP | A-4-103014 | 4/1992 |
| JP | 10-4227 | * 1/1998 |
| JP | A-10-162326 | 6/1998 |
| JP | 10-255231 | * 9/1998 |

OTHER PUBLICATIONS

Sato et al, Spin–Valve–Like Properties and Annealing Effect in Ferromagnetic Tunnel Junctions, IEEE Transactions on Magnetics, vol. 33, Issue 5, Part 2, Apr. 1997, pp. 3553–3555.*

Soulen et al, Conduction Across the Interface Between a Superconductor and a Spin Polarized Metal, IEEE Transactions on Applied Superconductivity, vol. 9, Issue 2, Part 3, Sep. 1998, pp. 3636–3639.*

Raider et al, "Nb/Nb oxide/Pb–alloy Josephson Tunnel Junctions", IEEE Transactions on Magnetics, vol. 17, Issue 1, Jan. 1981, pp. 299–302.*

Maekawa et al., *Electron Tunneling Between Ferromagnetic Films,* IEEE Transactions on Magnetics, vol. MAG–18, No. 2, pp. 707–708.

* cited by examiner

*Primary Examiner*—A. Dexter Tugbang
(74) *Attorney, Agent, or Firm*—Oliff & Berridge, PLC

(57) ABSTRACT

A method of manufacturing a ferromagnetic tunnel junction element, having an insulating film, a first ferromagnetic film and a second ferromagnetic film, including a step of turning the ferromagnetic tunnel junction element on electricity for a given period before a practical operation of the ferromagnetic tunnel junction element, so that a resistance of the insulating film is stabilized.

7 Claims, 16 Drawing Sheets

METHOD FOR STABILIZING PROPERTIES OF A FERROMAGNETIC TUNNEL JUNCTION ELEMENT

BACKGROUND OF THE INVENTION

1) Field of the Invention

This invention relates to a method for stabilizing properties of a ferromagnetic tunnel junction element, particularly, a method of stabilizing the resistance of an insulating film to divide a first ferromagnetic film and a second ferromagnetic film in the ferromagnetic tunnel junction element.

2) Related Art Statement

A ferromagnetic tunnel junction element has a junction structure of ferromagnetic film/insulating film/ferromagnetic film. S. Maekawa and V. Gafvert et al. have shown theoretically and experimentally in "IEEE Trans. Magn.", Mag-18, 707 (1982) that the junction structure of ferromagnetic film/insulating film/ferromagnetic film exhibit a ferromagnetic tunnel effect depending on the relative angle of magnetization of both ferromagnetic films. The "ferromagnetic tunnel effect" means the phenomenon that tunnel current to pass through a tunnel barrier layer changes depending on the relative angle of magnetization in both ferromagnetic films of an element having the junction structure of ferromagnetic film/insulating film/ferromagnetic film when a current flows in the element. The tunnel barrier layer is composed of a thin insulating film through which electron can pass with keeping spin condition, for example, a thin insulating film with a thickness of about 10 Å. Since tunnel probability becomes larger if the relative angle of magnetization in both ferromagnetic films is smaller, the resistance for the current between both ferromagnetic films decreases. Conversely, since the tunnel probability becomes smaller if the relative angle of magnetization in both ferromagnetic films is larger, the resistance increases.

The tunnel barrier layer is generally composed of a thin insulating film with a thickness of about 10 Å which can be formed by oxidizing a metallic film such as Al. Since such a thin metallic film is formed by thin film forming technique such as sputtering, it has a thickness distribution corresponding to the surface-roughness of an underlayer.

Since the ferromagnetic tunnel junction element has a large magnetic field sensitivity, it has large promise as a reproducing element in super high density magnetic recording of 10 Gbit/inch$^2$ or over. It is possible that the ferromagnetic tunnel junction element is used for another memory. For example, Kokai Publication Tokukai Hei 4-42417 (JP A 4-42417) discloses a thin film magnetic head having a ferromagnetic tunnel junction effective film which can detect the change of minute leakage magnetic flux in high sensitivity and high resolution, and enhance its reproducing sensitivity through the decrease of the generation probability of pin hole in its insulating film by narrowing its junction area.

Moreover, Kokai Publication Tokukai Hei 10-162326 (JP A 10-162326) discloses the ferromagnetic tunnel junction element, which is used for memory and external magnetic field detection, having the ferromagnetic layer in which magnetic moment does not rotate at the time of applying a magnetic field of effective intensity.

In using the above ferromagnetic tunnel junction element as a reading element in a thin film magnetic head, however, it is found that the resistance of the ferromagnetic tunnel junction element is decreased with practical operation time, and thus, the reproducing output is degraded. It is assumed that the thinner part of the tunnel barrier layer of the ferromagnetic tunnel junction element is short-circuited by the thermal energy due to a sense current at the practical operation of the reading element because the tunnel barrier layer is composed of a thin insulating film with a thickness of 10 Å and thus, has a thickness distribution corresponding to the surface-roughness of an underlayer.

SUMMARY OF THE INVENTION

It is an object of the present invention to provide a method for stabilizing properties of a ferromagnetic tunnel junction element whereby its property fluctuation can be repressed at its practical operation.

For achieving the object, this invention relates to a method for stabilizing properties of a ferromagnetic tunnel junction element comprising the step of turning the ferromagnetic tunnel junction element on electricity for a given period before its practical operation.

The above step short-circuits electrically (breaks-down softly) thinner parts of the insulating film as the tunnel barrier layer in the ferromagnetic tunnel junction element in advance, and thereby, can stabilize the resistance of the insulating film at its practical operation. Therefore, the stabilizing method of the present invention can repress the property fluctuation of the ferromagnetic tunnel junction element at the practical operation thereof. The stabilizing method decreases the output power of the ferromagnetic tunnel junction element slightly, but the decrease degree of the output power is negligible at the practical operation of the ferromagnetic tunnel junction element.

It is desired that the current to be supplied in the above stabilizing step is larger than that in the practical operation, which can reduce the stabilizing time. A current generator can supply the above current in the stabilizing process.

Moreover, the stabilizing step is preferably carried out at room temperature or over, which results in the acceleration of the stabilization and thereby, the shortening of the stabilizing time. However, it is desired that the stabilizing temperature is 300° C. or below. If the stabilizing temperature is more than 300° C., the ferromagnetic tunnel junction element is thermally damaged, so that its TMR (tunnel magnetoresistive effect) variation ratio is decreased extremely.

The current value to be supplied in the stabilizing step is determined on the current supplying time. That is, a large current can shorten the current supplying time and a small current requires a long current supplying time.

It is desired that the voltage to be applied to the ferromagnetic tunnel junction element is 2V or below. If a voltage more than 2V is applied, the insulating film constituting the tunnel barrier layer may be destroyed.

The stabilizing method of the present invention can be applied for stabilizing properties of at least one ferromagnetic tunnel junction element in a thin film magnetic head.

In this case, the stabilizing method may be applied for each element or whole elements at the same time. Concretely, ferromagnetic tunnel junction elements, each included in each of plural thin film magnetic heads, are connected in series, and thereafter, the above stabilizing method is carried out.

The stabilizing method of the present invention can be also applied for a wafer having many aligned thin film magnetic head elements. In this case, the wafer is improved a little. Concretely, the ferromagnetic tunnel junction elements, each included in each of the thin film magnetic head elements, are in series connected successively, and turned on electricity during a given period. To connect the ferromagnetic tunnel junction elements in series, two terminals of each element are connected successively by conductors. According to the present invention, the stabilization for the ferromagnetic tunnel junction elements can be efficiently carried out. The stabilizing step may be performed in any manufacturing step of the thin film magnetic head elements on the wafer, but is preferably done in the last manufacturing step.

The stabilizing method of the present invention can be applied for a bar shaped head aggregation having plural thin film magnetic heads in a line. The bar shaped head aggregation is produced by cutting out a wafer having plural thin film magnetic heads, and air bearing surface processing and polishing etc., are carried out for the bar shaped head aggregation. The stabilizing process may be performed in any manufacturing step of the bar shaped head aggregation, but is preferably done in the last manufacturing step after the above processing and polishing.

BRIEF DESCRIPTION OF THE DRAWINGS

For a better understanding of this invention, reference is made to the attached drawings, wherein.

DETAILED DESCRIPTION OF PREFERRED EMBODIMENTS

Figure 1:
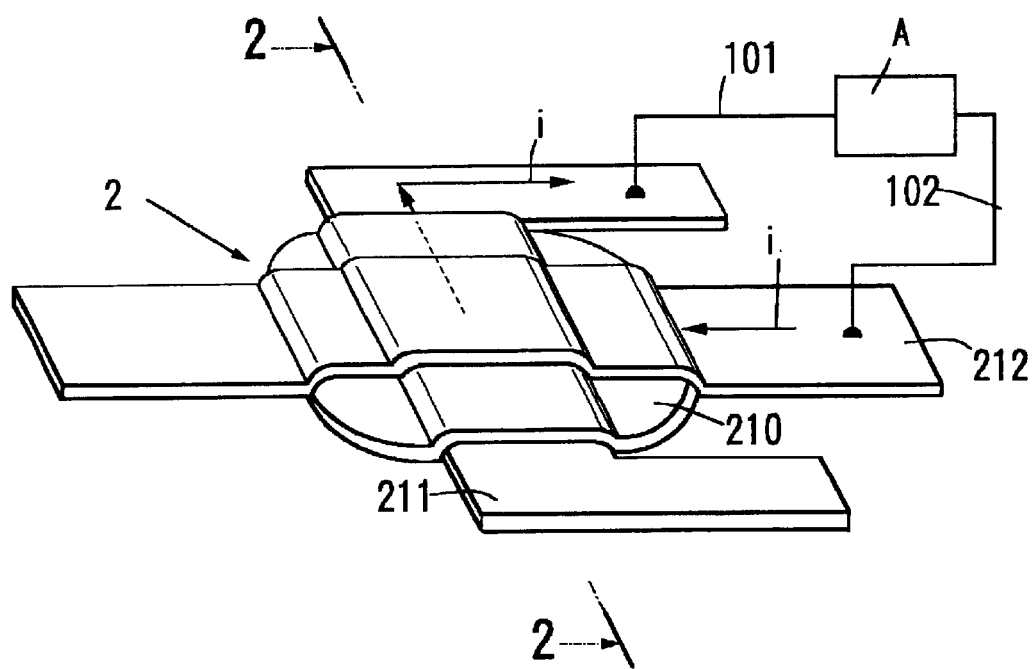
FIG. 1 is a view for explaining a stabilizing method for TMR element properties according to the present invention.
Figure 2:
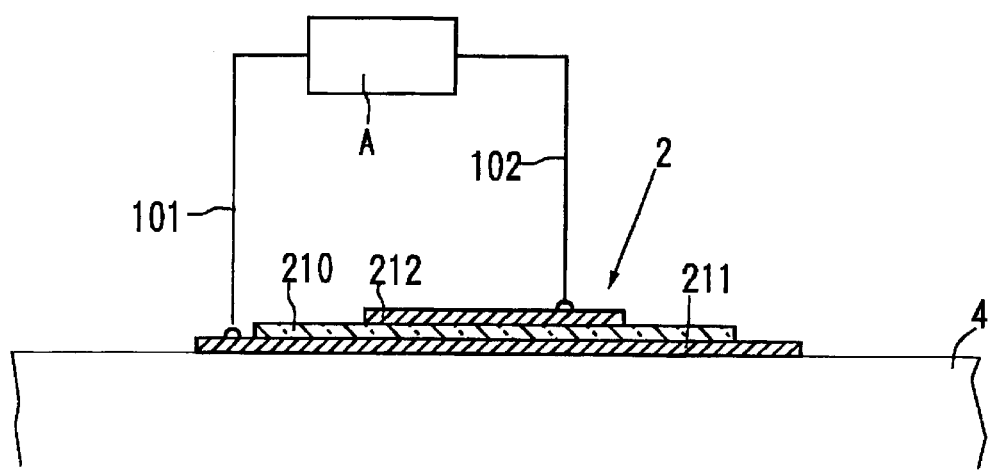
FIG. 2 is a cross sectional view, taken on line "2—2" of FIG. 1.

FIG. 1 is a view for explaining a stabilizing method for TMR element properties according to the present invention, and FIG. 2 is a cross sectional view, taken on line "2—2" of FIG. 1. In these figures, an electric power supply "A" and a ferromagnetic tunnel junction element 2 are depicted. The electric power supply A is preferably composed of a current generator which can control its current value. The ferromagnetic tunnel junction element (hereinafter, called as "TMR element) 2 includes an insulating film 210, a first ferromagnetic film 211 and a second ferromagnetic film 212. The first and the second ferromagnetic films 211 and 212 are stacked via the insulating film 210. These films are provided on a given insulated supporting substrate 4. Although a real TMR element has generally a multilayered structure, not the three-layered structure shown in FIGS. 1 and 2, for simplification, the TMR element in this example has the above three layered structure which is a required minimum layered structure for its fundamental practical operation. Wirings 101 and 102 connect the electric power supply to the first and second ferromagnetic films 211 and 212.

The property stabilizing method of the present invention includes the step of flowing a current "i" in the TMR element 2 for a given period from the electric power supply A. This step can short-circuit (dielectric break-down) and remove the thinner parts of the insulating film 210 in advance which bring about the resistance fluctuation and output fluctuation of the film 210. Therefore, the property fluctuation of the TMR element 2 can be prevented. The stabilizing step decreases the output of the TMR element 2 slightly, but the decrease degree is negligible.

It is desired that the current i to be supplied in the stabilizing step is larger than that in the practical operation of the TMR element 2. Thereby, the stabilizing time can be shortened. The above current generator can supply the above current i surely.

The stabilizing step is preferably carried out at a room temperature or over. Thereby, the stabilizing step is enhanced and can be shortened in time. It is desired that the stabilizing temperature is 300° C. or below, particularly 270° C. or below. If the stabilizing temperature is more than 300° C., the TMR element 2 is thermally damaged, and thus, the TMR variation ratio is decreased extremely.

The value of the current i in the stabilizing step is determined on its current supplying time and temperature atmosphere. If the current i is larger, the current supplying time is shortened, and if the current i is smaller, the current supplying time is elongated. Moreover, if the temperature atmosphere is higher, the current supplying time is shortened. As mentioned above, however, the temperature atmosphere has the above temperature restriction.

Figure 3:
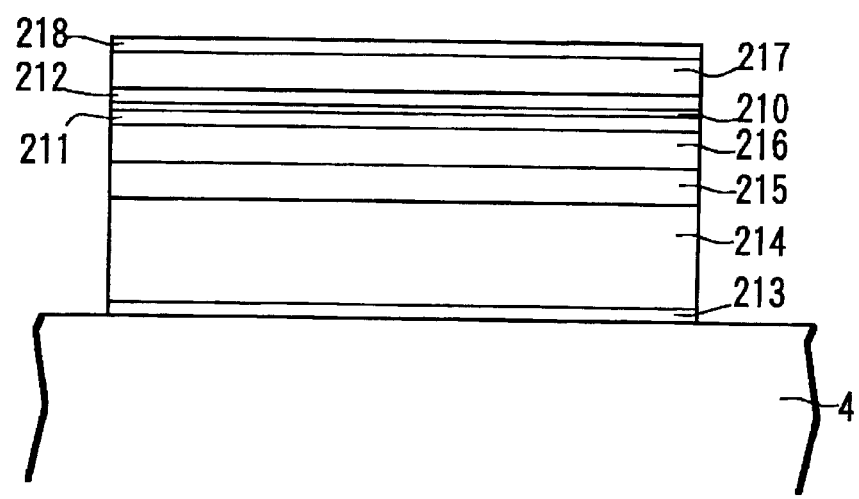
FIG. 3 is a view showing the film structure of the TMR element as an embodiment.

Then, the stabilizing step will be described in detail with reference to experimental data. FIG. 3 shows the film structure of the TMR element used in this stabilizing experiment. The TMR element 2 has a nine-layered structure on an insulated supporting substrate 4. Concretely, the layered structure has, on the substrate 4, the following layers:

A Ta film 213 with a thickness of 50 Å,
A Cu film 214 with a thickness of 500 Å,
A Ta film 215 with a thickness of 100 Å,
A NiFe film 216 with a thickness of 100 Å,
A CoFe film (first ferromagnetic film) 211 with a thickness of 20 Å,
An $Al_7$—$O_2$ film (insulating film) 210 with a thickness of 10 Å,
A CoFe film (second ferromagnetic film) 212 with a thickness of 30 Å,
A RuRhMn film 217 with a thickness of 100 Å, and
A Ta film 218 with a thickness of 50 Å, which are stacked in turn. The film structure can be applied not only for this experiment, but also for a real TMR element. However, the film compositions, the layered structure and film thicknesses are exemplified, and are not limited to the above ones. The element size is 1 μm.

COMPARATIVE EXAMPLE

The TMR element having the above film structure in FIG. 3 was turned on electricity by a current with 1 mA for 1000 hours at 70° C. Herein, the current value and the temperature are supposed to be adopted for its practical operation. In this case, such a wire connection as in FIGS. 1 and 2 was employed.

Figure 4:
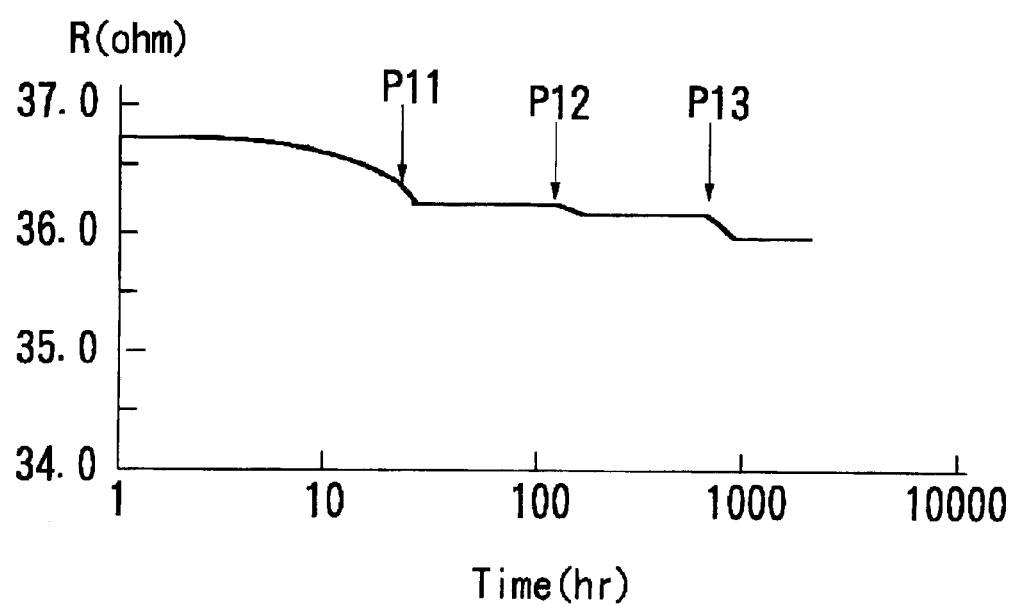
FIG. 4 is a graph showing experimental data in the stabilizing process for the TMR element in FIG. 3 when a current with 1 mA is applied for the TMR element for 1000 hours at 70° C.

FIG. 4 shows the obtained experimental data. In FIG. 4, the axis of abscissas denotes "time (hour)" in logarithmic scale and the axis of ordinate denotes "resistance R (ohm)". The resistance R belongs to the insulating film 210 (see, FIGS. 1–3).

As shown in FIG. 4, a first soft break-down P11, a second soft break-down P12 and a third soft break-down P13 occur at about 30 hours, about 100 hours and about 800 hours, respectively. Then, the resistance R steps down at each soft break-down. Therefore, if the TMR element is used in a long time without any improvement, the resistance of the TMR element is decreased and the detection output thereof is degraded.

Example 1

The TMR element having the film structure in FIG. 3 was turned on electricity by a current with 7 mA larger than the above current with 1 mA, which is supposed to be applied in its practical operation, for 1000 hours at 70° C. as its practical operation temperature. In this case, such a wire connection as in FIGS. 1 and 2 was employed.

Figure 5A:
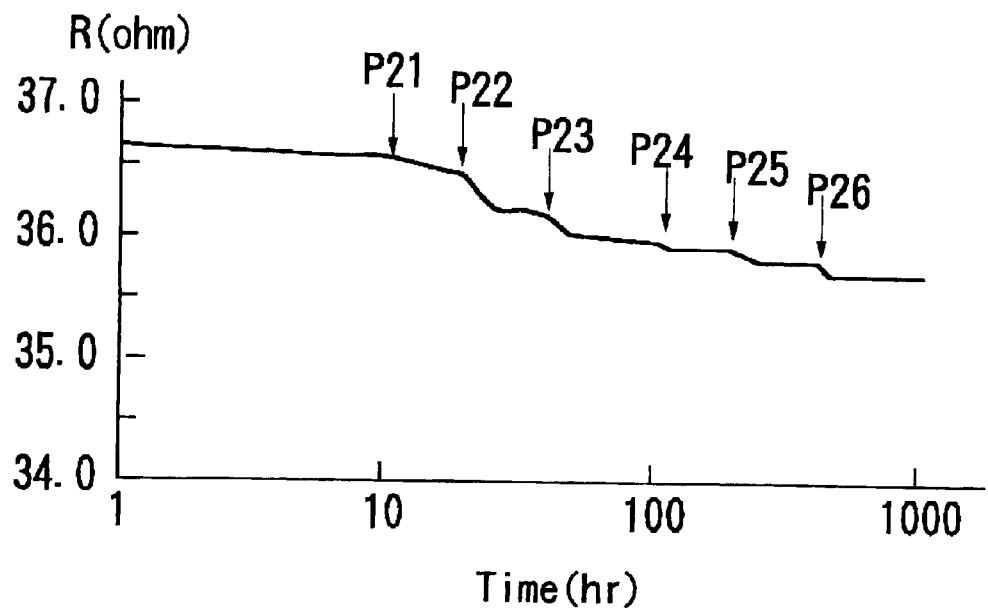
FIG. 5A is a graph showing experimental data in the stabilizing process for the TMR element in FIG. 3 when a current with 7 mA is applied for the TMR element for 1000 hours at 70° C.

FIG. 5A shows the obtained experimental data. The axis of abscissas and the axis of ordinate have the same scale as in FIG. 4. As shown in FIG. 5A, three soft break-downs P21 to P23 occur during the turning on electricity for 10–100 hours, and three soft break-down P24 to P26 occur during the turning on electricity for 100–1000 hours. The resistance R has a constant value of about 35.7 (ohm) at the turning on electricity of more than 1000 hours.

Figure 5B:
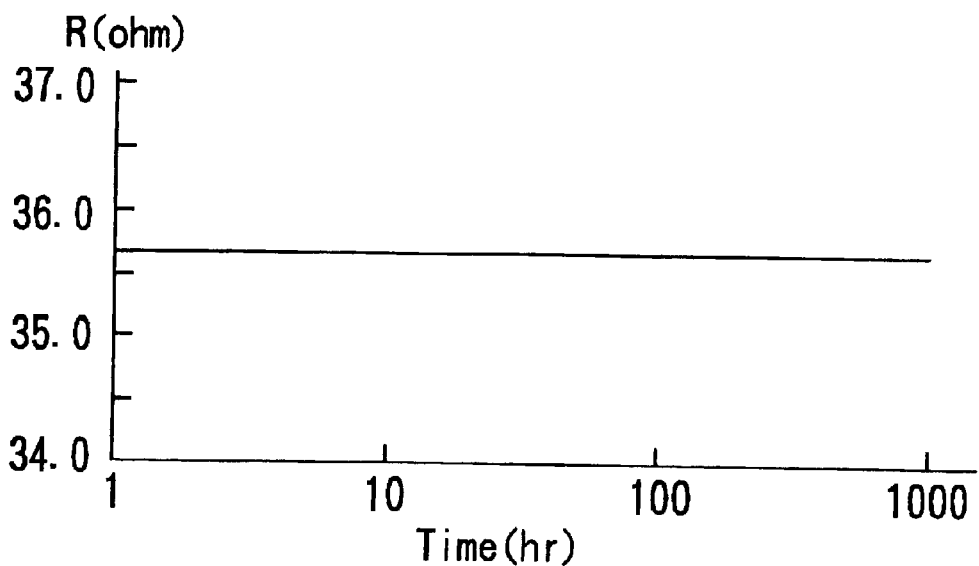
FIG. 5B is a graph showing experimental data when a current with 1 mA is applied for the TMR element for 1000 hours after the stabilizing process.

FIG. 5B shows the experimental data of the stabilized TMR element in FIG. 5A when a current with 1 mA, which is supposed to be flown during practical operation, is supplied. The axis of abscissas and the axis of ordinate have the same scale as in FIG. 4. As shown in FIG. 5B, such a soft break down does not occur in the stabilized TMR element after the turning on electricity for 1000 hours by the current with 1 mA.

Example 2

The TMR element having the film structure in FIG. 3 was turned on electricity by a current with 7 mA larger than the above current with 1 mA for 50 hours at 70° C. In this case, such a wire connection as in FIGS. 1 and 2 was employed.

Figure 6A:
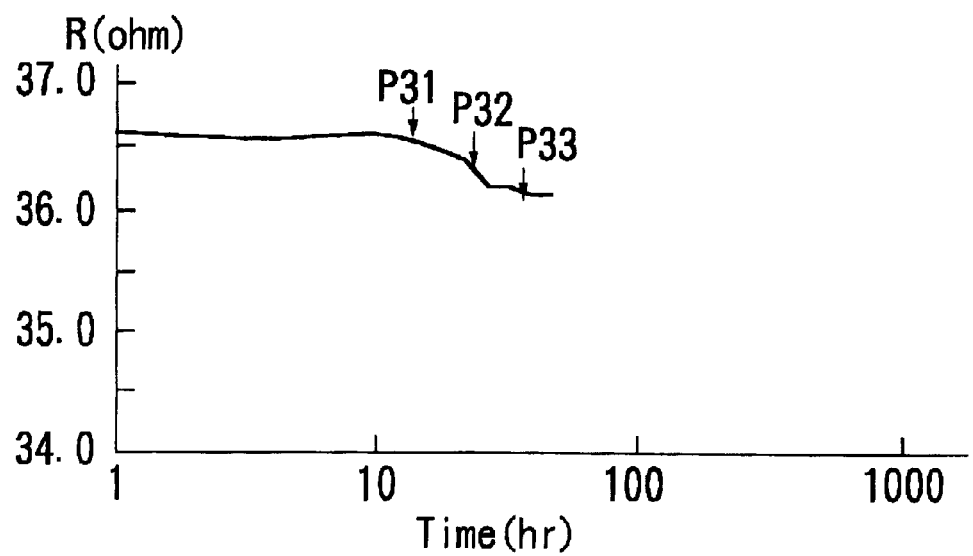
FIG. 6A is a graph showing experimental data in the stabilizing process for the TMR element in FIG. 3 when a current with 7 mA is applied for the TMR element for 50 hours at 70° C.

FIG. 6A shows the obtained experimental data. As shown in FIG. 6A, three soft break-downs P31 to P33 occur during the turning on electricity for 10–50 hours.

Figure 6B:
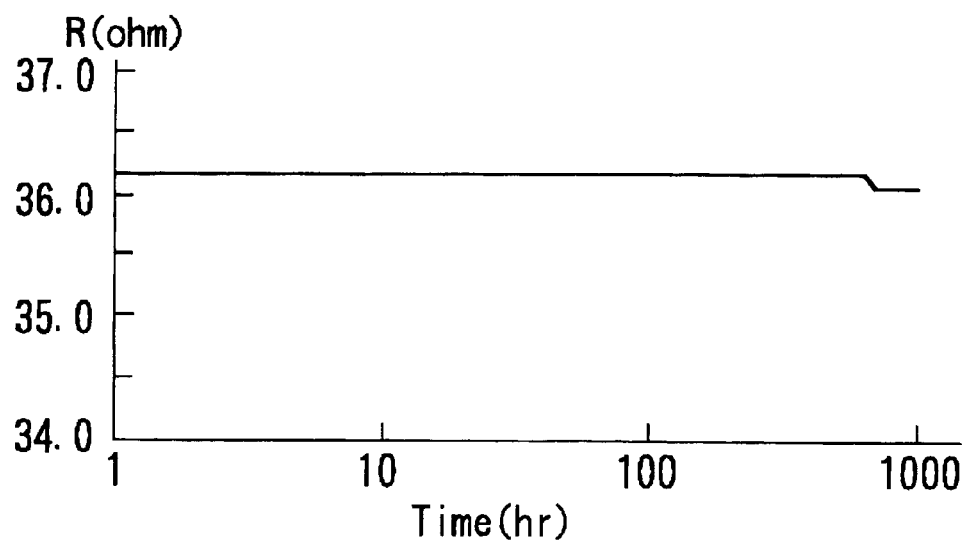
FIG. 6B is a graph showing experimental data when a current with 1 mA is applied for the TMR element for 1000 hours after the stabilizing process.

FIG. 6B shows the experimental data of the stabilized TMR element in FIG. 6A when a current with 1 mA, which is supposed to be flown during practical operation, is supplied. As shown in FIG. 6B, a soft break down occurs in the stabilized TMR element after the turning on electricity for about 1000 hours by the current with 1 mA. That is, in this example, the stabilization for the TMR element is not sufficient.

Example 3

The TMR element having the film structure in FIG. 3 was turned on electricity by a current with 15 mA larger than the above current with 1 mA for 24 hours at 70° C. In this case, such a wire connection as in FIGS. 1 and 2 was employed.

Figure 7A:
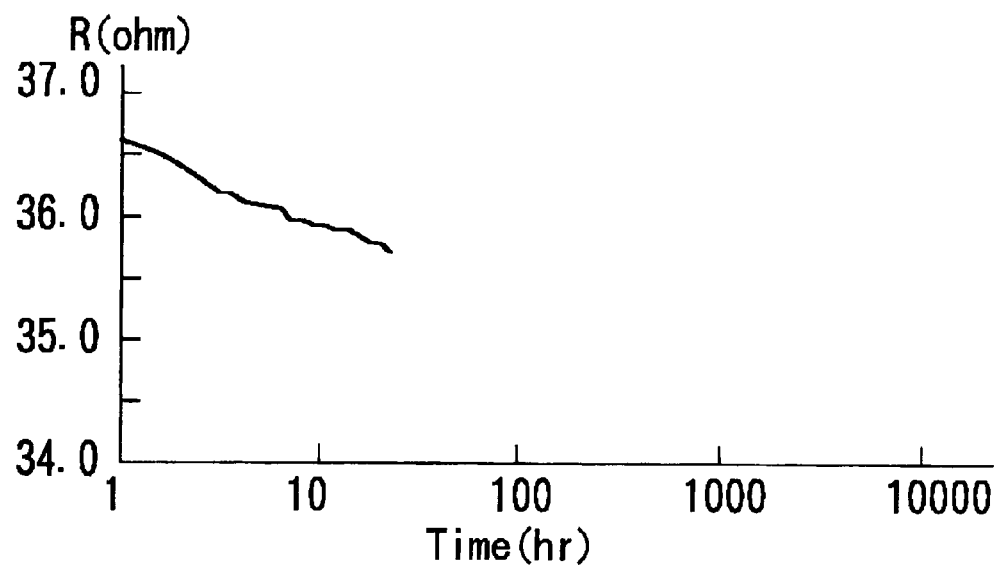
FIG. 7A is a graph showing experimental data in the stabilizing process for the TMR element in FIG. 3 when a current with 15 mA is applied for the TMR element for 24 hours at 70° C.

FIG. 7A shows the obtained experimental data. As shown in FIG. 7A, several soft break-downs occur during the turning on electricity for 24 hours.

Figure 7B:
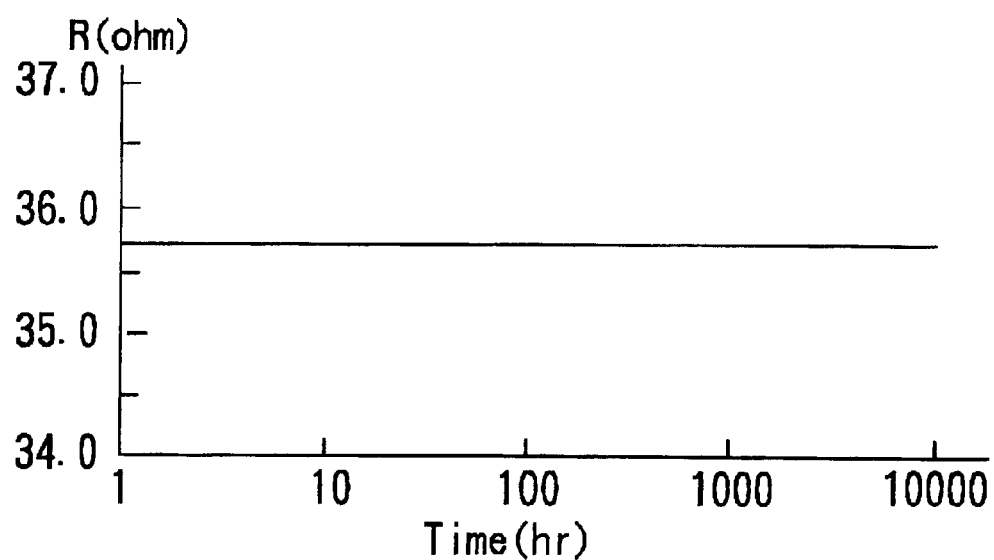
FIG. 7B is a graph showing experimental data when a current with 0.2 mA is applied for the TMR element for 10000 hours after the stabilizing process.

FIG. 7B shows the experimental data of the stabilized TMR element in FIG. 7A when a current with 1 mA is supplied. As shown in FIG. 7B, a soft break down does not occur in the stabilized TMR element after the turning on electricity for about 10000 hours by the current with 0.2 mA. This means that larger stabilizing current can shorten the stabilizing time.

Example 4

The TMR element having the film structure in FIG. 3 was turned on electricity by a current with 7 mA larger than the above current with 1 mA, which is supposed to be applied in its practical operation, for 24 hours at 180° C.

Figure 8A:
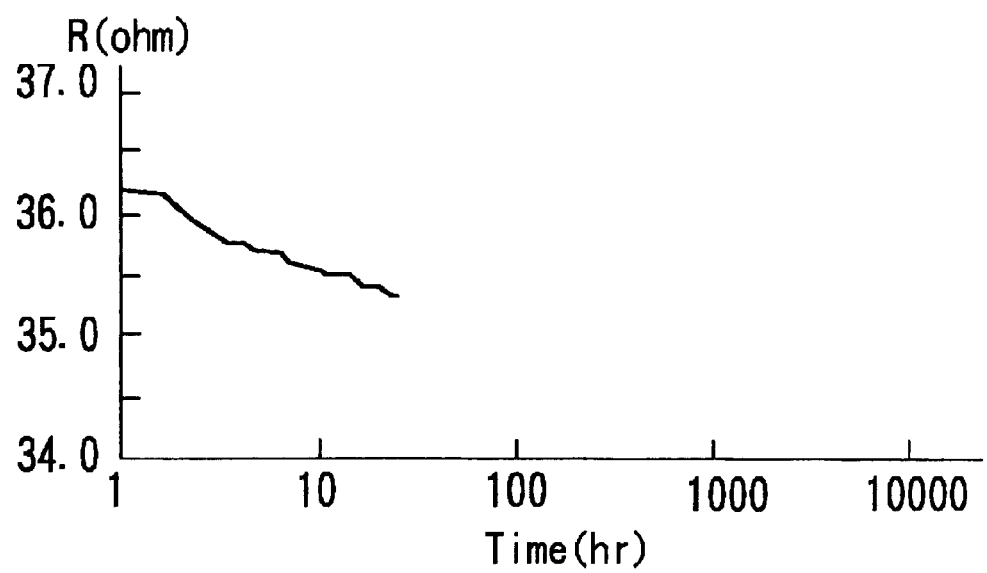
FIG. 8A is a graph showing experimental data in the stabilizing process for the TMR element in FIG. 3 when a current with 7 mA is applied for the TMR element for 24 hours at 180° C.

FIG. 8A shows the obtained experimental data. As shown in FIG. 8A, several soft break-downs occur during the turning on electricity for 24 hours.

Figure 8B:
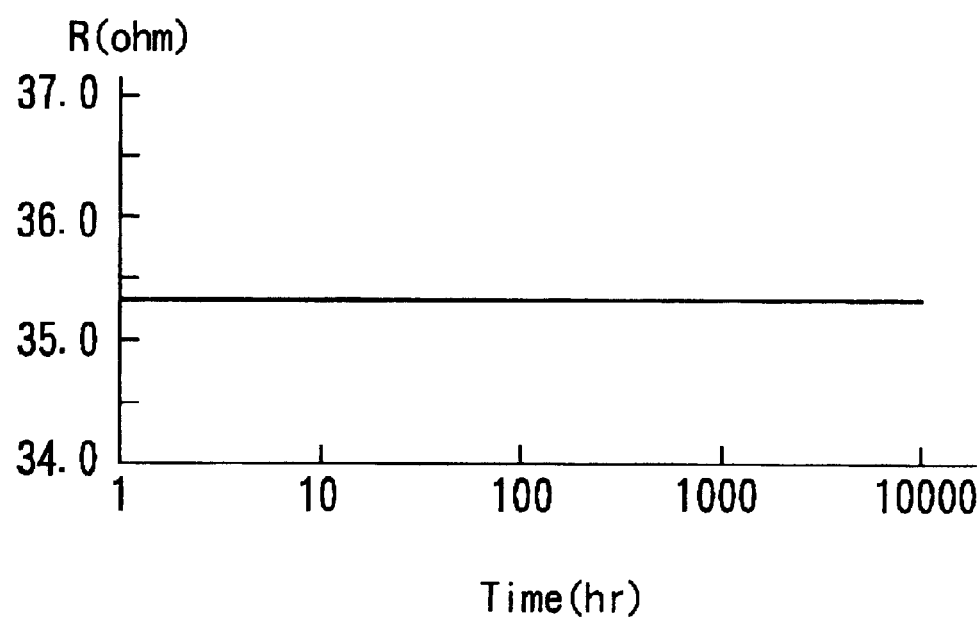
FIG. 8B is a graph showing experimental data when a current with 0.2 mA is applied for the TMR element for 10000 hours after the stabilizing process.

FIG. 8B shows the experimental data of the stabilized TMR element in FIG. 8A when a current with 0.2 mA, which is supposed to be flown in its practical operation, is supplied. As shown in FIG. 8B, a soft break down does not occur in the stabilized TMR element after the turning on electricity for about 10000 hours by the current with 0.2 mA. This means that a larger stabilizing temperature can shorten the stabilizing time.

Figure 9:
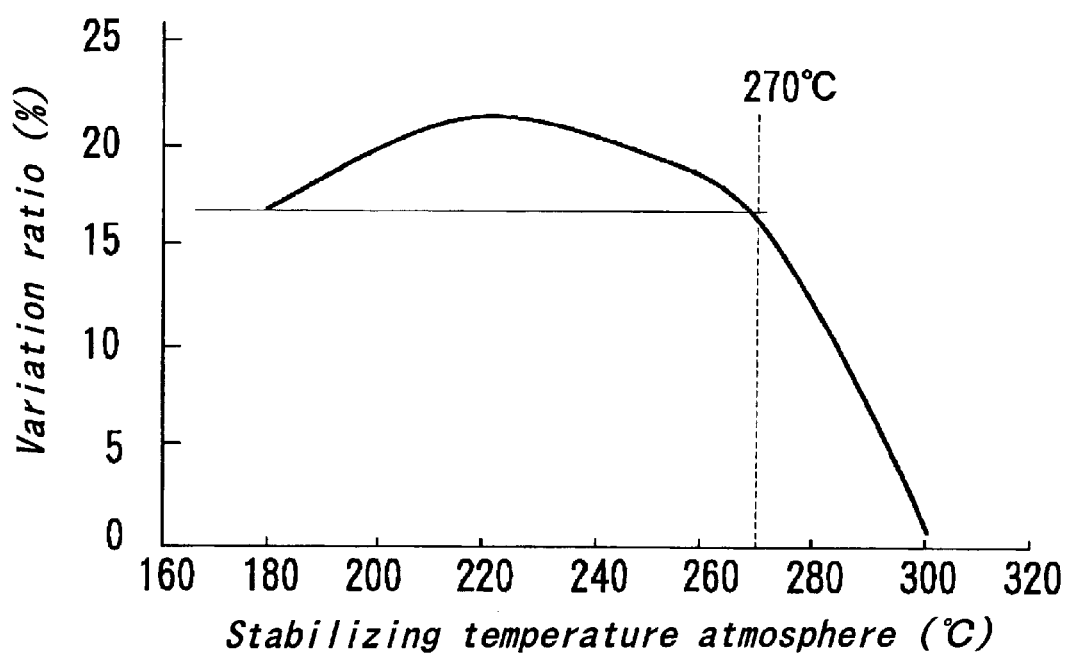
FIG. 9 is a graph the relation between the stabilizing temperature atmosphere of the TMR element and the TMR variation ratio.

FIG. 9 is a graph showing the relation between the stabilizing temperature atmosphere (° C.) of the TMR element and the TMR variation ratio (%). The experimental data in FIG. 9 are obtained from a TMR element having a similar film structure to the one shown in FIG. 3. The stabilization for the TMR element were performed at the temperature atmospheres of 180° C., 220° C., 250° C., 270° C., 290° C. and 300° C. for one hour under a magnetic field of 3 kOe.

As shown in FIG. 9, the TMR variation ratio decreases within a temperature atmosphere range of 250–300° C. Particularly, the TMR variation ratio decreases remarkably at a temperature atmosphere of more than 300° C. Therefore, although it is effective to increase the temperature atmosphere in order to shorten the stabilizing time, it is desired that the temperature atmosphere is not more than 300° C., particularly 270° C. Then, the temperature atmosphere of 180–270° C. can provide the TMR variation ratio of 15% or over.

The voltage to be applied for the TMR element is preferably 2V or below in the above turning on electricity. If a voltage of 2V or over is applied, the insulating film 210 constituting the tunnel barrier layer may be destroyed.

Adoption for a Thin Film Magnetic Head

The TMR element in the present invention plays an important role as a reading element of a thin film magnetic head. Therefore, the stabilization for the properties of the thin film magnetic head will be explained hereinafter.

Figure 10:
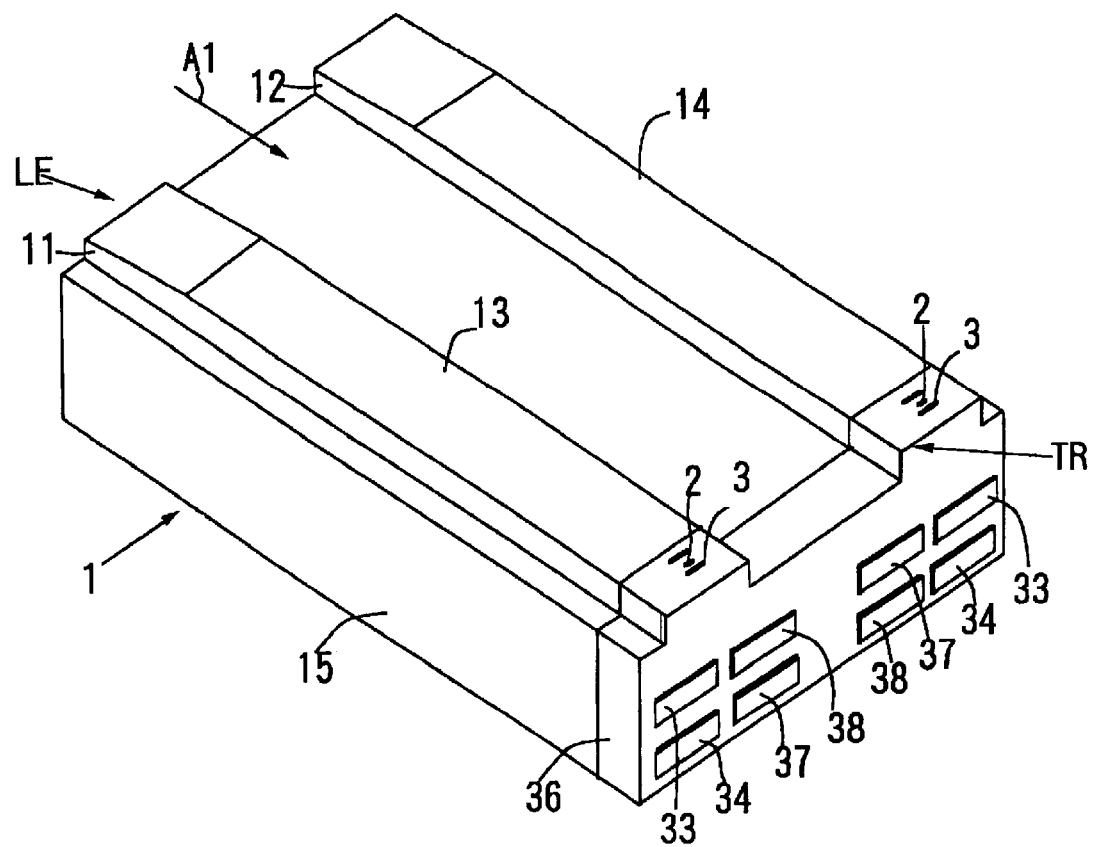
FIG. 10 is a perspective view of a thin film magnetic head.

FIG. 10 is a perspective view of the thin film magnetic head. In this figure, each part is illustrated with exaggeration. The illustrated thin film magnetic head has a slider 1, a TMR element 2 as a reading element and an inductive type magnetic conversion element 3 as a writing element.

The slider 1 has rail parts 11 and 12 on its medium opposing surface. The surfaces of the rail parts 11 and 12 are employed as air bearing surfaces (hereinafter, called as "ABS"s) 13 and 14. The slider 1 does not always have the two rail parts 11 and 12, and may have one to three rail parts. Moreover, the slider may a flat surface having no rail part. For improving its floating characteristic, the slider may have a medium opposing surface with a variety of geometrical shape. The present invention can be applied for any kind of thin film magnetic head with the above slider.

The TMR element 2 and the inductive type magnetic conversion element 3 are provided on one end surface in an air outflow side TR of either or both of the rail parts 11 and 12. A medium moving direction A1 corresponds to an air outflow direction at the time when the medium moves at a high velocity. An air flows between an air inflow side LE and the air outflow side TR. On the end in the air outflow side TR of the slider 1 are provided pull-out electrodes 33 and 34 connected to the TMR element 2 and pull-out electrodes 37 and 38 connected to the inductive type magnetic conversion element 3.

Figure 11:
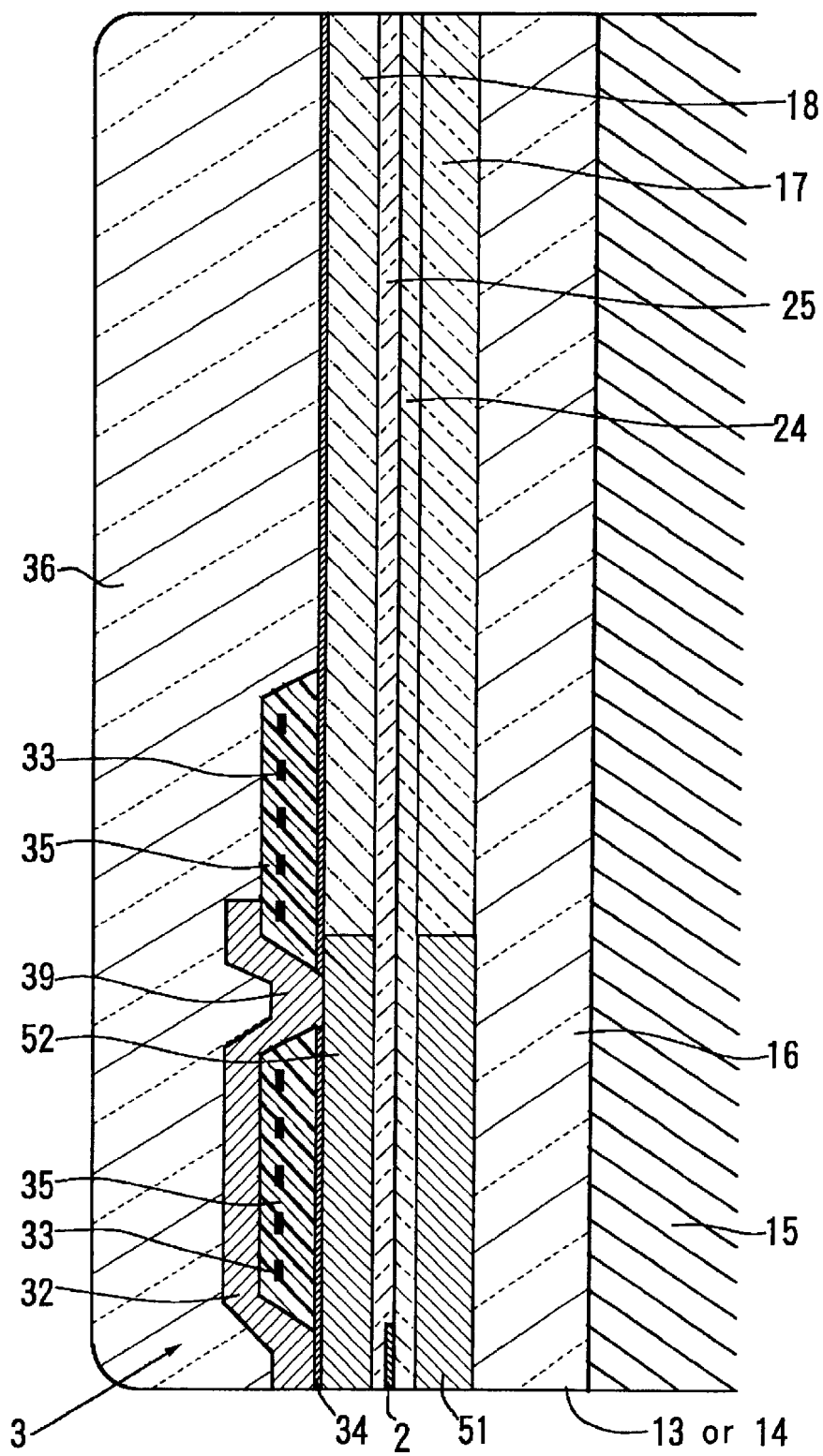
FIG. 11 is an enlarged cross sectional view of the magnetic conversion element area of the thin film magnetic head shown in FIG. 10.

FIG. 11 is an enlarged cross sectional view of the magnetic conversion element area of the thin film magnetic head shown in FIG. 10. The TMR element 2 and the inductive type magnetic conversion element 3 are provided on an insulating film 16 on a ceramic substrate 15 to constitute the slider 1. The ceramic substrate 15 is normally made of a $Al_2O_3$—TiC material. Since the $Al_2O_3$—TiC material has a conductivity, the insulating film 16 is formed in order to electrically insulate the TMR element, etc., against the ceramic substrate 15.

Figure 12:
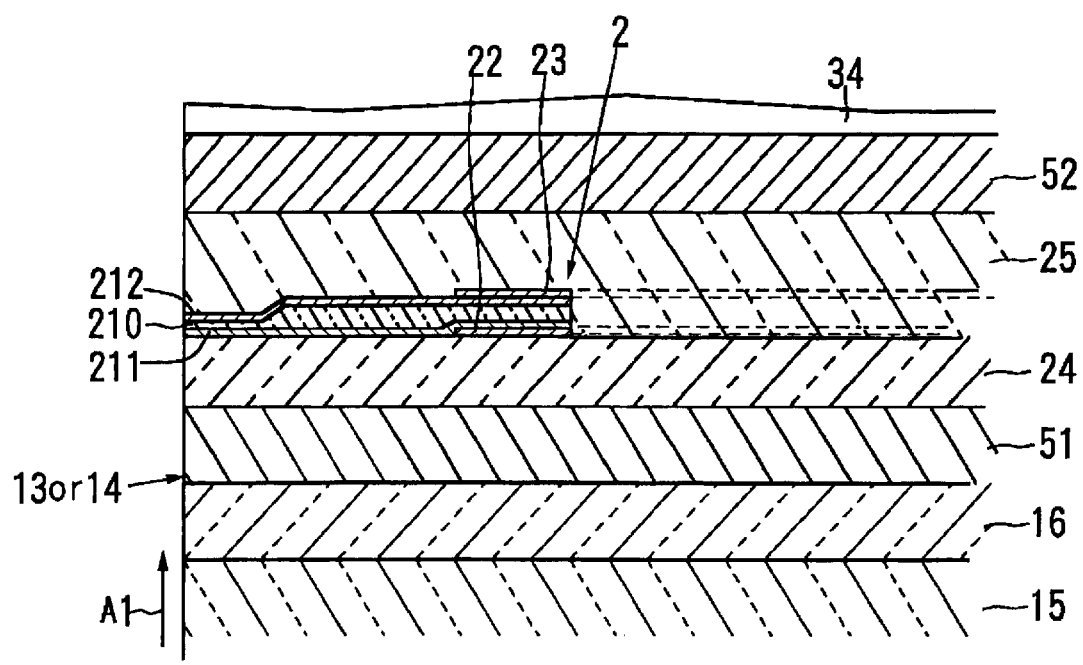
FIG. 12 is an enlarged cross sectional view of the TMR element area of the thin film magnetic head shown in FIGS. 10 and 11.

FIG. 12 is an enlarged cross sectional view of the TMR element 2 area. The TMR element 2 has a similar film structure to the one in FIGS. 1–4. That is, the TMR element 2 includes the insulating film 210, the first ferromagnetic film 211 and the second ferromagnetic film 212. The first and the second ferromagnetic films 211 and 212 are stacked via the insulating film 210.

Electrode films 22 and 23 includes a first electrode film 22 and a second electrode film 23. The first electrode film 22 is connected to the first ferromagnetic film 211, and the second electrode film 23 is connected to the second ferromagnetic film 212. The first and second electrode films 22 and 23 are provided so as not to be exposed to the ABS 13 (or 14).

The TMR element 2 is provided in insulating supporting films 24 and 25 between a bottom magnetic shielding film 51 and a top magnetic shielding film 52. The bottom magnetic shielding film 51 is formed on the insulating film 16 on the ceramic substrate 15, and the insulating supporting film 24 is formed on the bottom magnetic shielding film 51. Not shown in the figure, a magnetic domain controlling means to form a single domain in the first and second ferromagnetic films 211 and 212 is installed. Moreover, a magnetization immobilizing means is installed which makes parallel to an external magnetic field the axis of easy magnetization in a free ferromagnetic film and makes orthogonal to the external magnetic field the axis of easy magnetization in a pinned ferromagnetic film. The free ferromagnetic film and the pinned ferromagnetic film are composed of either of the first and second ferromagnetic films 211 and 212, respectively.

The inductive type magnetic conversion element 3 has a bottom magnetic film 52 doubling as the top magnetic shielding film in the TMR element 2, a top magnetic film 32, a coil film 33, a gap film 34, an insulating film 35 made of an organic resin such as a novolac resin and a protection film 36 made of alumina. The forefronts of the bottom and the top magnetic films 52 and 32 constitute a bottom pole portion and a top pole portion, respectively, which are opposed via the gap film 34 with a minute thickness. The writing for a magnetic medium is carried out by the bottom and top pole portions. The yoke portions of the bottom and top magnetic films 52 and 32 are joined each other at a back gap portion backward from the bottom and top pole portions so as to complete a magnetic circuit. The coil film 33 is formed in the insulating film 35 so as to wind spirally around the joining portion of the yoke portions. Both ends of the coil film 33 are electrically connected to the pull-out electrodes 37 and 38. The winding number and layer number of the coil film 33 is not restricted. Moreover, the inductive type magnetic conversion element 3 may have any kind of film structure.

Figure 13:
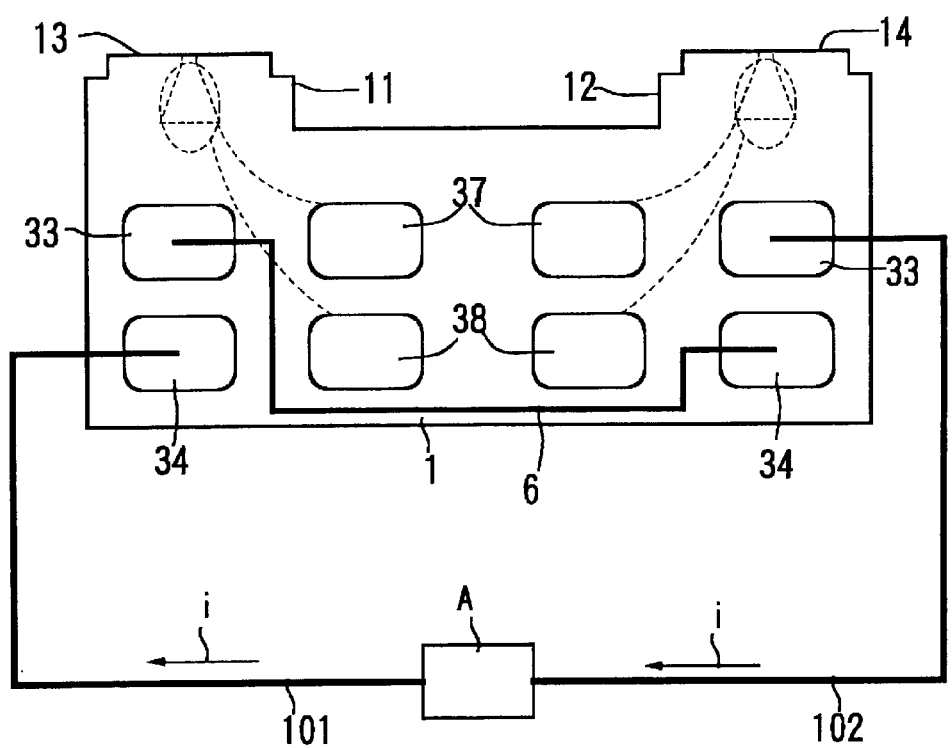
FIG. 13 is a view for explaining a stabilizing method for the thin film magnetic head shown in FIGS. 10–12.

FIG. 13 is a view for explaining a stabilizing method for the thin film magnetic head shown in FIGS. 10–12. Before the practical operation of the thin film magnetic head, the TMR element 2 is turned on electricity for a given period by the electric power supply A, concretely, the electric power supply A is connected to the pull-out electrodes 33 and 34, and supplied the TMR element 2 with a constant current i. In this example, since two TMR elements are provided on the rail parts 11 and 12, respectively, they are connected in series and then, the current i is supplied to the TMR elements from the electric power supply A.

This step short-circuits electrically (breaks-down softly) the thinner parts of the insulating film 210 in the TMR element 2 which bring about the resistance fluctuation and output fluctuation of the film 210 in advance, and thereby, can stabilize the resistance of the insulating film at its practical operation. Therefore, the stabilizing method of the present invention can repress the property fluctuation of the TMR element at the practical operation thereof.

As mentioned above, it is desired that the current i to be supplied in the stabilizing step is larger than that in the practical operation, and the stabilzing step is carried out at a temperature atmosphere of 300° C. or below, particularly 180–270° C. Moreover, the voltage to be applied to the TMR element is preferably 2V or below.

Figure 14:
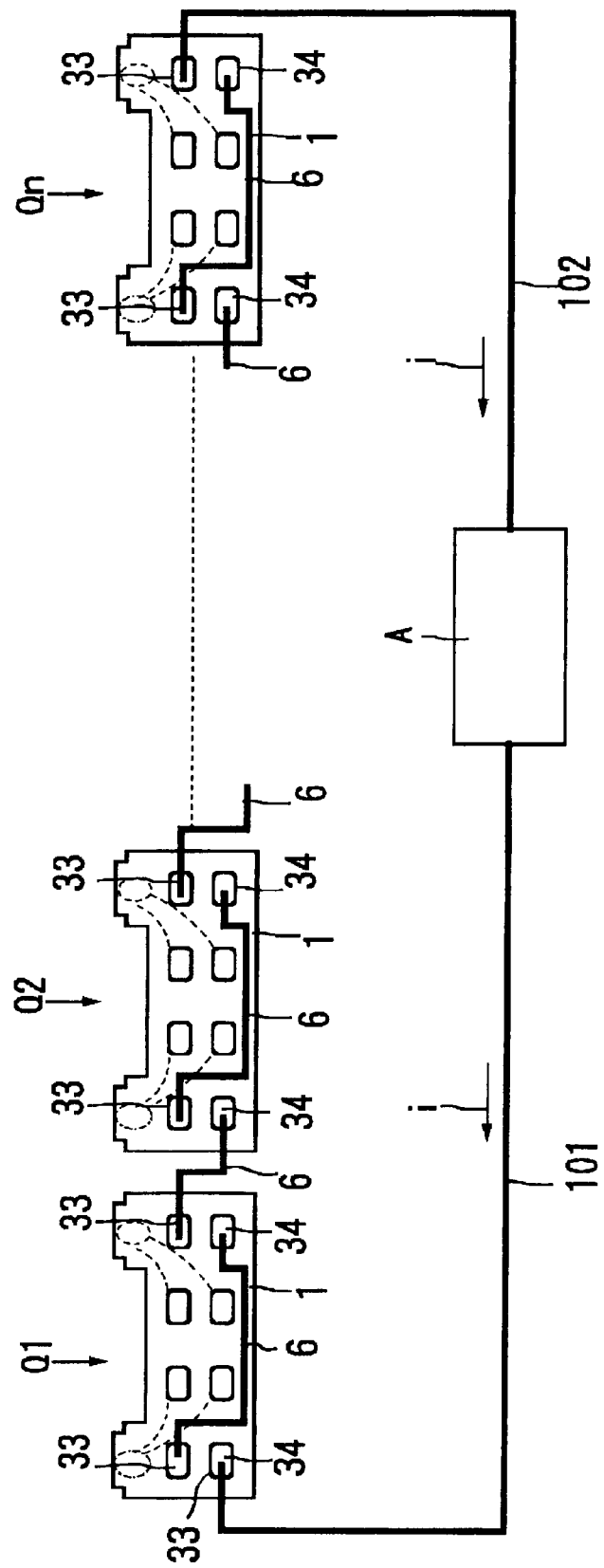
FIG. 14 is a view for explaining another stabilizing method for a thin film magnetic head.

FIG. 14 is a view for explaining another stabilizing method for a thin film magnetic head. In this example, there are thin film magnetic heads Q1–Qn. The thin film magnetic heads Q1–Qn are electrically connected so that all the TMR elements included in the magnetic heads can be connected in series one another. Then, in the connection in series, the thin film magnetic head are stabilized in their properties by supplying the current i from the electric power supply A. According to this stabilizing step, the thin film magnetic head can be stabilized in their properties efficiently.

Moreover, the probable fault of the TMR element 2 is the electrical short-circuit of the insulating film 210 between the first and the second ferromagnetic films 211 and 212. Therefore, when the TMR elements, each included in each of the thin film magnetic heads Q1–Qn, are electrically connected in series, and in this condition, the stabilizing step is carried out, as shown in FIG. 14, the stabilizing step can be performed regardless of faults of one or plural TMR elements.

Figure 15:
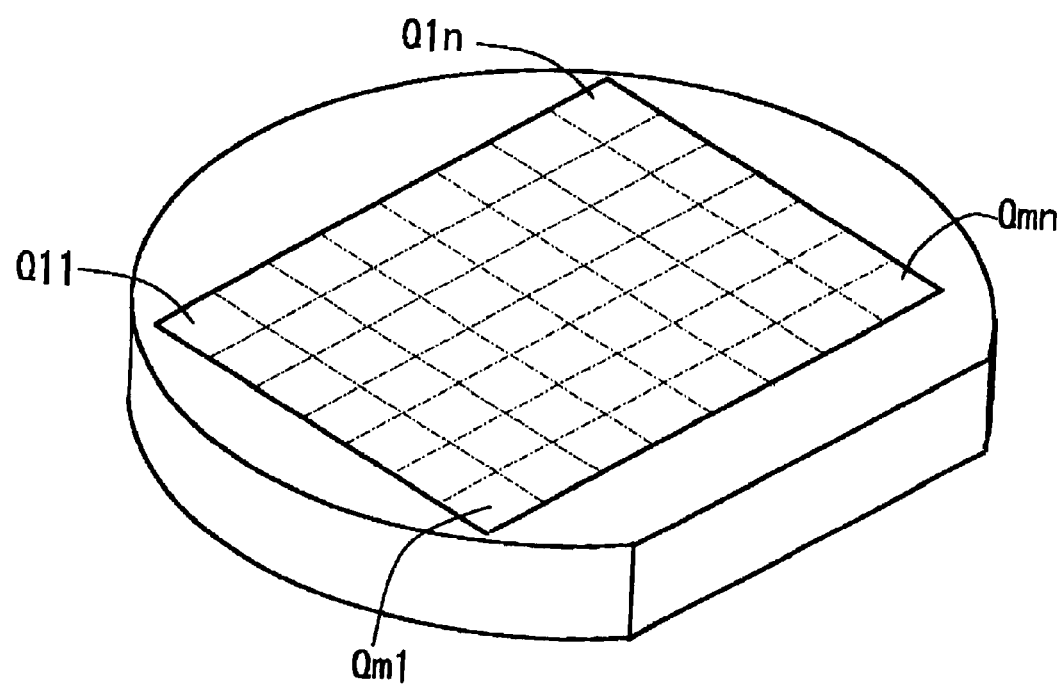
FIG. 15 is a perspective view showing a wafer having many aligned thin film magnetic head elements.
Figure 16:
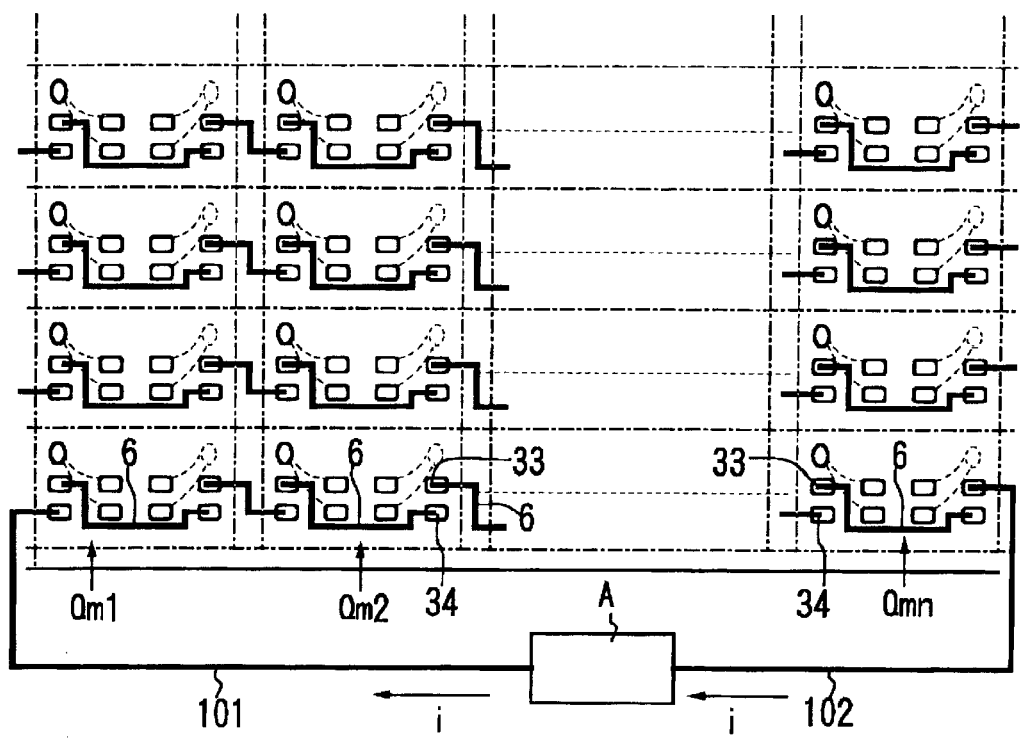
FIG. 16 is a view for explaining a stabilizing method for many thin film magnetic head elements on the wafer shown in FIG. 15.

FIG. 15 is a perspective view of a wafer having many aligned thin film magnetic head elements, and FIG. 16 is a view for explaining a stabilizing method for many thin film magnetic head elements on the wafer shown in FIG. 15.

As shown in FIG. 15, the wafer has many thin film magnetic head elements Q11–Qnm which are arranged in lattice with n rows and m columns. Each of the thin film magnetic head elements Q11–Qnm has the film structure shown in FIGS. 10–12 with at least one TMR element. Each TMR element has terminals 33 and 34 derived outside.

Then, as shown FIG. 16, the TMR elements included in the thin film magnetic head elements Q11–Qnm are connected in series by conductors 6 continuing to the terminals 33 and 34. The conductor 6 may be made of an organic conductive paste which can be removed later by resolution.

Subsequently, as shown in FIG. 16, the current i for stabilization is supplied to the TMR elements in series connected, included in the thin film magnetic head elements Qm1–Qnm in the m-th column from the electric power supply A for a given period. The same step is carried out for the thin film magnetic head elements in first through m-th column. In this example, the stabilizing step can be performed efficiently.

Moreover, as mentioned above, since the probable fault of the TMR element is the electrical short-circuit of the insulating film 210 between the first magnetic film 211 and the second magnetic films 212, the stabilizing step can be performed even if one or plural of the above thin film magnetic head elements are brought-down.

Figure 17:
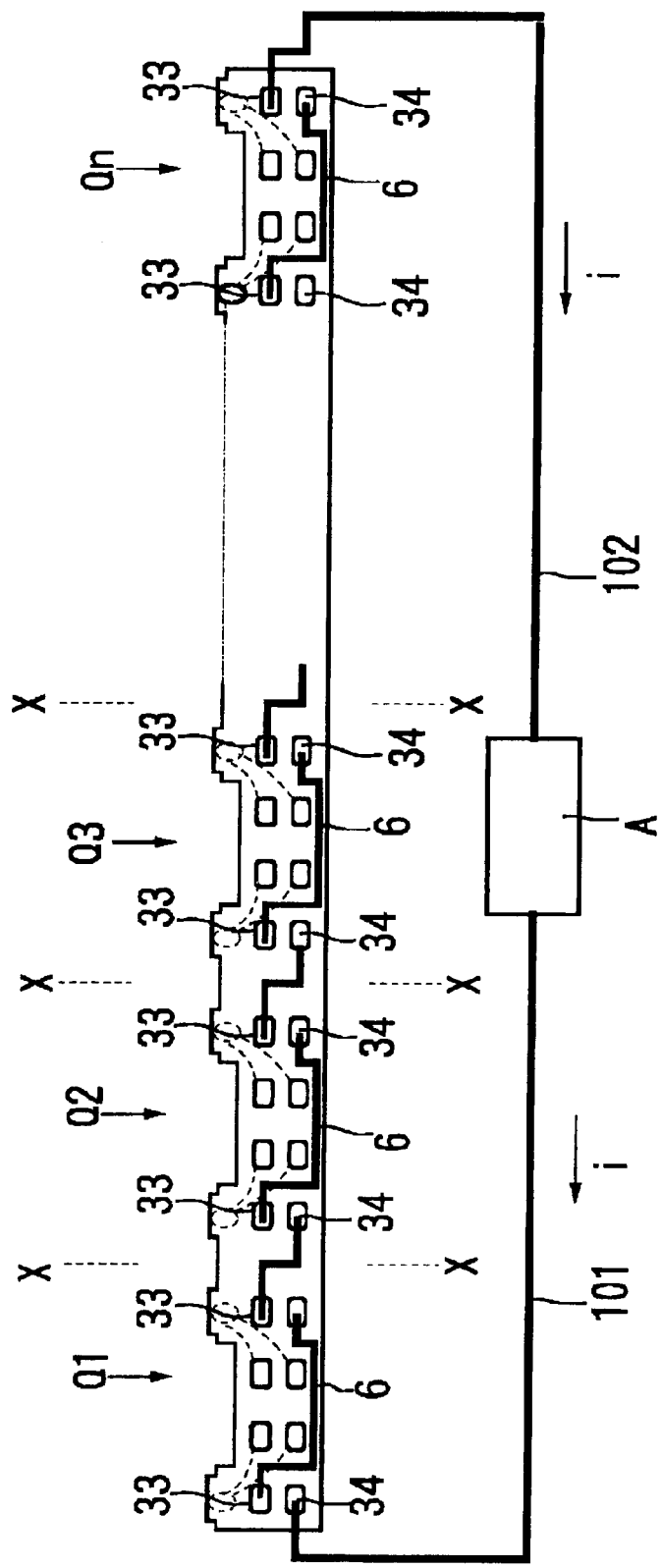
FIG. 17 is a view for explaining a stabilizing method for aligned plural thin film magnetic head elements included in a bar shaped head aggregation.

FIG. 17 is a view for explaining a stabilizing method for aligned plural thin film magnetic head elements Q1–Qn included in a bar shaped head aggregation. The bar shaped head aggregation can be obtained by cutting out the wafer shown in FIGS. 15 and 16 in a manufacturing step before completing one thin film magnetic head. Rail part processing, ABS geometrical processing and polishing, etc., are carried out for the bar shaped head aggregation.

In the bar shaped head aggregation, each of the TMR elements included in the thin film magnetic head elements Q1–Qn has the terminals 33 and 34. And all the TMR elements are connected in series through the conductors 6 continuing to the terminals 33 and 34 as in FIGS. 14 and 16.

The current i is supplied to the TMR elements in series connected from the electric power supply A for a given period, and thereby, the stabilization for the thin film magnetic head elements Q1–Qn are carried out.

In this example, the stabilizing step for the thin film magnetic head elements can be performed efficiently. Even though one or plural TMR elements are brought down, the stabilizing step can be performed. The bar shape head aggregation is cut out on the line "X—X" after every manufacturing step is carried out. Then, after the cutting step, completed thin film magnetic heads are obtained.

This invention has been described in detail with reference to the above preferred example, but it is obvious for the ordinary person skilled in the art that various modifications can be made in its configuration and detail without departing from the scope of this invention.

As mentioned above, according to the present invention, the property stabilizing method for the TMR element can be provided which can repress its property fluctuation at its practical operation.

What is claimed is:

1. A method for manufacturing a ferromagnetic tunnel junction element comprising a step of short-circuiting the ferromagnetic tunnel junction element by applying a current to the element for a given period before a practical operation of the ferromagnetic tunnel junction element in order to stabilize properties of the ferromagnetic tunnel junction element, the current applied during the step of short-circuiting being larger than a current applied during practical operation of the element.

2. The method for manufacturing the ferromagnetic tunnel junction element as defined in claim 1, wherein a voltage to be applied to the ferromagnetic tunnel junction element in the short-circuiting is 2V or below.

3. The method for manufacturing the ferromagnetic tunnel junction element as defined in claim 1, wherein the ferromagnetic tunnel junction element includes a first ferromagnetic film, a second ferromagnetic film and an insulating film between the first and second ferromagnetic films, and a change in resistance of the insulating film is reduced by the step of short-circuiting.

4. The method for manufacturing the ferromagnetic tunnel junction element as defined in claim 1, wherein the short-circuiting step is carried out under temperature atmosphere of 300° C. or below.

5. The method for manufacturing the ferromagnetic tunnel junction element as defined in claim 4, wherein the short-circuiting step is carried out under a temperature atmosphere within 180–270° C.

6. A method for manufacturing a thin film magnetic head including at least one ferromagnetic tunnel junction element, comprising a step of short-circuiting the ferromagnetic tunnel junction element by applying a current to the element for a given period before a practical operation of the ferromagnetic tunnel junction element in order to stabilize properties of the ferromagnetic tunnel junction element, the current applied during the step of short-circuiting being larger than a current applied during practical operation of the element.

7. A method for manufacturing each of thin film magnetic heads, each head including at least one ferromagnetic tunnel junction element, comprising a step of short-circuiting the at least one ferromagnetic tunnel junction element by applying a current to the element for a given period in order to stabilize properties of the ferromagnetic tunnel junction element, the current applied during the step of short-circuiting being larger than a current applied during practical operation of the element.

* * * * *